United States Patent [19]
Kokubo

[11] Patent Number: 5,173,914
[45] Date of Patent: Dec. 22, 1992

[54] SEMICONDUCTOR LASER DEVICE

[75] Inventor: Yoshihiro Kokubo, Itami, Japan

[73] Assignee: Mitsubishi Denki Kabushiki Kaisha, Tokyo, Japan

[21] Appl. No.: 756,805

[22] Filed: Sep. 9, 1991

[30] Foreign Application Priority Data

Oct. 17, 1990 [JP] Japan .................................. 2-281061

[51] Int. Cl.⁵ .............................................. H01S 3/19
[52] U.S. Cl. ........................................ 372/49; 372/46; 372/43
[58] Field of Search ............................ 372/49, 46, 43

[56] References Cited

U.S. PATENT DOCUMENTS 4,998,258  5/1991  Ikeda et al. ............................ 372/49

OTHER PUBLICATIONS

Ackley et al., "Phase-Locked Injection Laser Arrays With Integrated Phase Shifters", RCA Review, vol. 44, Dec. 1983, pp. 625-633.

Primary Examiner—Léon Scott, Jr.
Attorney, Agent, or Firm—Leydig, Voit & Mayer

[57] ABSTRACT

A semiconductor laser device having an active region with a wide and uniform width which supports propagation of fundamental and higher modes of oscillation includes a reflecting film coating having a reflectivity smaller than a reflectivity determined by the differences between the refractive index of the semiconductor that forms the active layer and air and having no spatial distribution of reflectivity in the direction of the width of the active region disposed on an emitting facet of the laser, and a reflecting film coating having a highest reflectivity at the center of the width of the active region, the reflectivity decreasing at the sides of the center, disposed on the facet opposite to the emitting facet. As a result, a semiconductor laser oscillating in the fundamental mode with high power light output is provided.

7 Claims, 4 Drawing Sheets

FIG.3
(PRIOR ART)
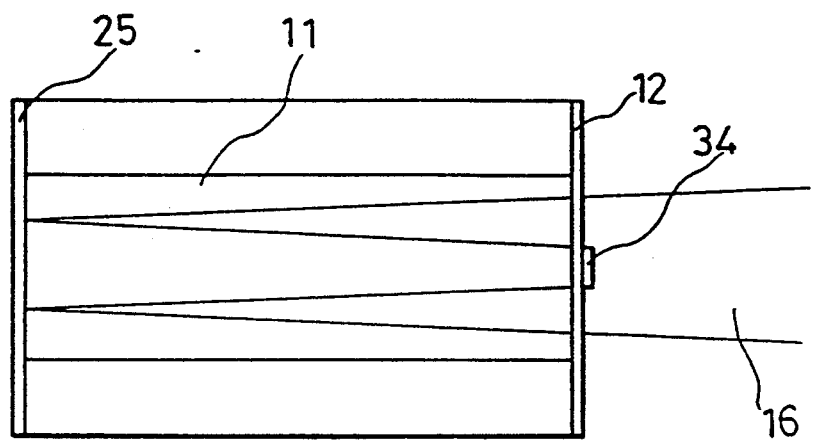
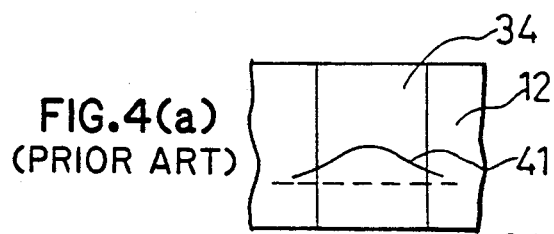
FIG.4(a)
(PRIOR ART)
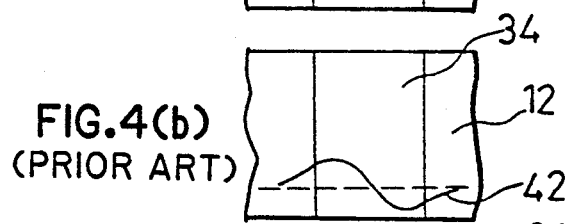
FIG.4(b)
(PRIOR ART)
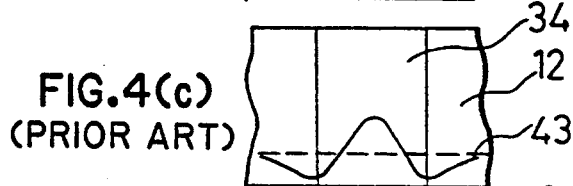
FIG.4(c)
(PRIOR ART)
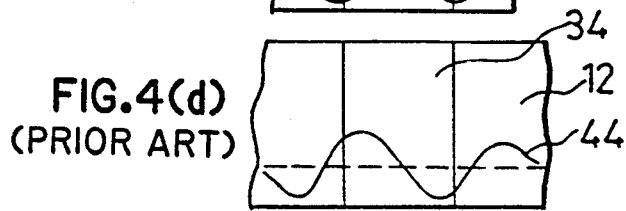
FIG.4(d)
(PRIOR ART)

FIG.5
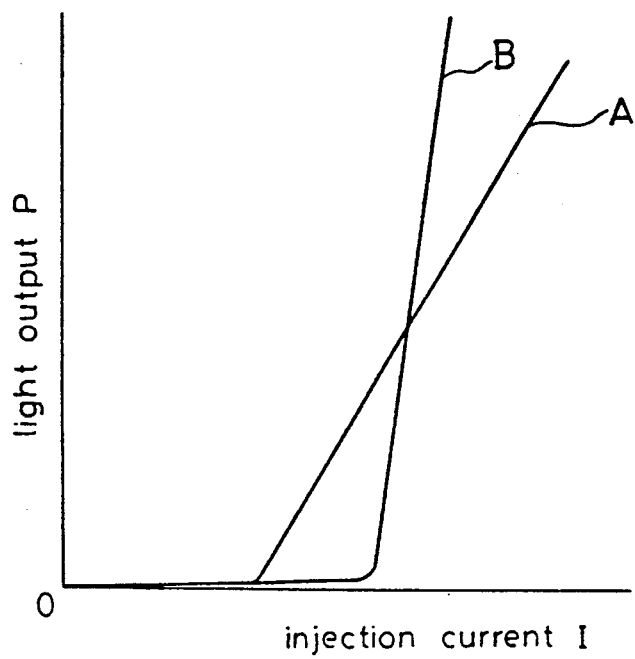
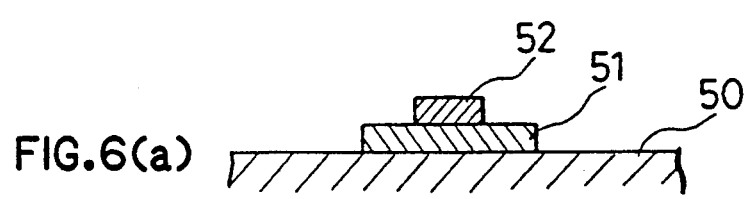
FIG.6(a)
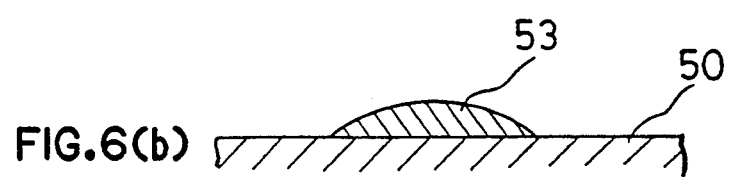
FIG.6(b)

SEMICONDUCTOR LASER DEVICE

FIELD OF THE INVENTION

The present invention relates to a semiconductor laser device and, more particularly, to a semiconductor laser device with single transverse mode oscillation with high output.

BACKGROUND OF THE INVENTION

FIG. 2 is a plan view showing the surface of an active layer of a conventional laser with a wide active region aiming at a single transverse mode. In FIG. 2, reference numeral 21 designates a fundamental mode propagation region, reference numeral 22 designates a mode magnifying region, reference numeral 15 designates a partially reflecting coating having low reflectivity, reference numeral 16 designates output light and reference numeral 25 designates a highly reflecting coating.

In the laser shown in FIG. 2, since a light waveguide for the fundamental mode propagation region 21 has a small width $w_1$ of 3 $\mu m \pm 2$ $\mu m$, the fundamental mode is only propagated, in principle. In this case, the reason why the width $w_1$ of the light waveguide has a range in its established value is because the thickness of the active layer or the like should be taken into consideration as a factor other than in addition to the width of the light waveguide. For example, when the active layer is thin, even if the width of the light waveguide is to some degree large, only fundamental mode oscillation is allowed. Or when the difference in refractive index between the light waveguide part and the parts on both sides of its small, even if the width of the light waveguide is large, only fundamental mode oscillation is allowed. The width of the light waveguide of the mode magnifying region 22 gradually increases from a connection to the light waveguide of the fundamental mode propagation region 21 to the facet. In this case, if the divergent angle $\theta_1$ of the waveguide is too large, light from the fundamental mode propagation region 21 is not magnified and then it reaches the facet as it is, so that high power light output can not be implemented. Alternatively, when the length $L_1$ of the mode magnifying region 22 is too long, the possibility that higher order modes of oscillation may occur while the laser beam propagates in the region 22 is increased, with the result that fundamental mode oscillation can not be obtained. In order to obtain the fundamental mode oscillation high power light output, the divergent angle $\theta_1$ is 10° or less and the length $L_1$ of the mode magnifying region 22 is 10 to 100 $\mu m$. Therefore, the width $w_2$ of the light waveguide on the emitting facet is 10 to 20 $\mu m$.

The fundamental mode generated in the fundamental mode propagation region 21 is amplified and magnified in the mode magnifying region 22 and then taken out as the output light 16 through the partially reflecting coating 15. The light partially reflected by the partially reflecting coating 15 reaches the opposite facet through the mode magnifying region 22 and the fundamental mode propagation region 21 and is reflected by the highly reflecting coating 25 again to contribute to oscillation. In this case, the reflectivity of the facet on which the partially reflecting coating 15 is applied is 3 to 18% and reflectivity of the facet on which the highly reflecting coating 25 is applied is 60 to 98%. FIG. 5 is a graph showing the difference in laser light output due to the reflectivity of the emitting facet. In the figure, the ordinate shows light output and the abscissa shows injection current. Reference character A designates the characteristic of a laser having a high reflectivity emitting facet and reference character B designates the characteristic of a laser having a low reflectivity emitting facet. As can be seen from this figure, the reflectivity on the emitting facet may be selected according to the desired light output.

According to the conventional laser, a high power light output is achieved by increasing the width of the output light 16 as described above. Actually, when a crystal of AlGaAs is used, oscillation in an 0.8 $\mu m$ wavelength band in a single transverse mode at a power of 100 mW or more has been observed.

In addition, FIG. 3 is a plan view showing an active layer surface of another conventional semiconductor laser device with a high output. In FIG. 3, the laser active region 11 is arranged at the center of the active layer in the direction of its width and a non-reflecting coating 12 whose reflectivity is approximately 3% is applied to the whole emitting facet. An partially reflecting partial coating 34 whose reflectivity is approximately 45% is applied to the center of the non-reflecting coating 12 in the direction of the width of the laser active region 11. A highly reflecting coating 25 whose reflectivity is approximately 98% is applied to the whole opposite facet of a resonator. Reference numeral 16 designates output light. In addition, the length of the resonator is approximately 500 $\mu m$.

FIGS. 4(a)–4(d) are graphs of intensity distribution of each mode when the front facet is viewed from the inside of the semiconductor laser device shown in FIG. 3. In FIGS. 4(a)–4(d), reference numeral 41 designates the intensity distribution of the fundamental mode, reference numeral 42 designates the intensity distribution of the primary mode, reference numeral 43 designates the intensity distribution of the secondary mode, and reference numeral 44 designates the intensity distribution of the tertiary mode.

Next, operation thereof will be described. The light generated in the laser active region 11 of the semiconductor laser device is mostly reflected by the highly reflecting coating 25 on the rear facet and amplified in the laser active region 11 and then reaches the non-reflecting coating 12 and the partially reflecting partial coating 34. The light which reaches the non-reflecting coating 12 is not reflected and becomes the output light 16. In addition, the light which reaches the partially reflecting partial coating 34 is partially transmitted and then becomes the output light 16 but the rest of the light is reflected and amplified in the laser active region 11 again and then reaches the non-reflecting coating 12 to contribute laser oscillation. In addition, although it is illustrated that the light reflected by the partially reflecting partial coating 34 and the highly reflecting coating 25 is considerably magnified in the resonator and most of the output light 16 is output through the non-reflecting coating 12 in FIG. 3, this magnification is small in fact and most of the output light 16 is output through the partially reflecting partial coating 34.

Next, the principle of fundamental transverse mode oscillation in accordance with this prior art laser device will be described. The width of the active region in this laser is large enough to allow a higher order mode of oscillation. In this case, when the frequency is fixed, spatial expansion in the transverse direction varies with the degree of the mode propagating in the semiconductor laser device. More specifically, as shown in FIGS. 4(a)–4(d) when the spatial width is fixed at the width of the partially reflecting partial coating 34, the energy within the width is the largest in the fundamental mode and becomes smaller as the degree of the mode increases. Therefore, since effective reflectivity is the highest in the fundamental mode, oscillation at the fundamental mode is most easily performed. In fact, a partially reflecting coating of AlGaAs with a width of 20 μm and reflectivity of approximately 40% is applied to an active region having a width of 150 μm for wavelength of 0.8 μm, oscillation in only the fundamental mode with a light output of 300 mW or more is obsserved.

However, in the prior art laser device shown in FIG. 2 the mode magnifying region 22 is not perfect because of small disturbances such as crystalline defects in the mode magnifying region formed when the semiconductor laser device is formed or differences in current gain within the mode magnifying region, so that the propagation mode is influenced in the mode magnifying region and a higher order mode oscillation occurs and is propagated. Thus, when the light output exceeds around 100 mW, the imperfections of the mode magnifying region 22 are gradually manifested together with lack of uniformity of a current, so that oscillation is likely to occur in the higher order mode.

In addition, according to the laser shown in FIG. 3, since the mode in the transverse direction is controlled only by a spatial film having no distribution in refractive index, there is almost no disturbance at the time of forming the waveguide as shown in FIG. 2, so that higher order mode oscillation is not likely to occur. However, as shown in FIG. 5, when the reflectivity of the facet is increased, laser oscillation can easily arise, but the output power is smaller than that when the reflectivity on the facet is low, which is the problem of the laser shown in FIG. 3. More specifically, when the reflectivity of the partial coating 34 is increased, oscillation can easily occur but the light is difficult to output. Therefore, this structure is effective in fundamental mode oscillation of a laser having a wide active region. However, it is not always effective as final means for high power light output.

SUMMARY OF THE INVENTION

An object of the present invention is to provide a semiconductor laser device in which the maximum light output in fundamental mode oscillation is increased twice or more compared to a laser having a wide active region.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to the present invention, in a semiconductor laser device having an active region with a wide and uniform width which allows propagation of higher order modes, a reflecting film coating having reflectivity smaller than that determined by the difference between the refractive index of the semiconductor crystal which forms the active layer and air and having no spatial distribution in the direction of the width of the active region is disposed on the emitting facet of the laser, and a reflecting film coating having a highest reflectivity at the center of the active region, which reflectivity is lowered gradually or stepwide at the sides is disposed on the other facet, opposite to the emitting facet, of the laser. As a result, a semiconductor laser device oscillating in the fundamental mode with high power light output is obtained.

In addition, according to the present invention, in a semiconductor laser device having an active region with a wide, uniform width which allows propagation of a higher order mode oscillation, a distribution of reflectivity which is the highest at the center of the active region and gradually decreases laterally is disposed on the facet opposite to the emitting facet and the relation between the width W at a section of the distribution and a length L of a laser resonator is $$L \geq 0.2 \frac{nW^2}{\lambda}$$

where n is refractive index in the laser resonator and λ is a wavelength of light in free space. As a result, oscillation in the fundamental mode can be arise most easily.

BRIEF DESCRIPTION OF THE DRAWINGS

FIG. 3 is a plan view showing an active layer surface of another conventional high power light output semiconductor laser device;

FIGS. 4(a)–4(d) are graphs of the distribution of light intensity of each mode when a front facet is seen from the inside of the conventional semiconductor laser device shown in FIG. 3;

FIG. 5 is a graph showing the relationship between injection current and light output depending on the reflectivity of an emitting facet; FIGS. 6(a) and 6(b) are views showing other embodiments of the present invention.

DETAILED DESCRIPTION OF PREFERRED EMBODIMENTS

An embodiment of the present invention will be described in detail in reference to the drawings hereinafter.

Figure 1:
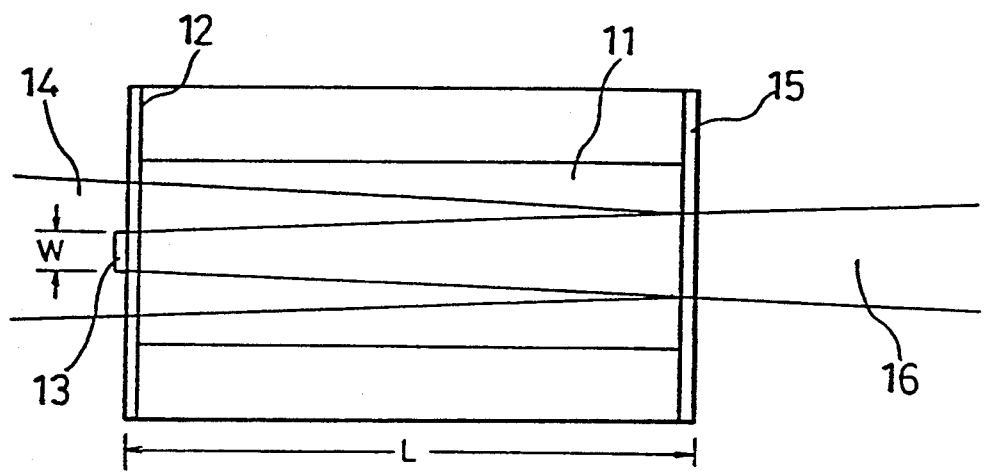
FIG. 1 is a plan view showing an active layer surface of a semiconductor laser device in accordance with an embodiment of the present invention.
Figure 2:
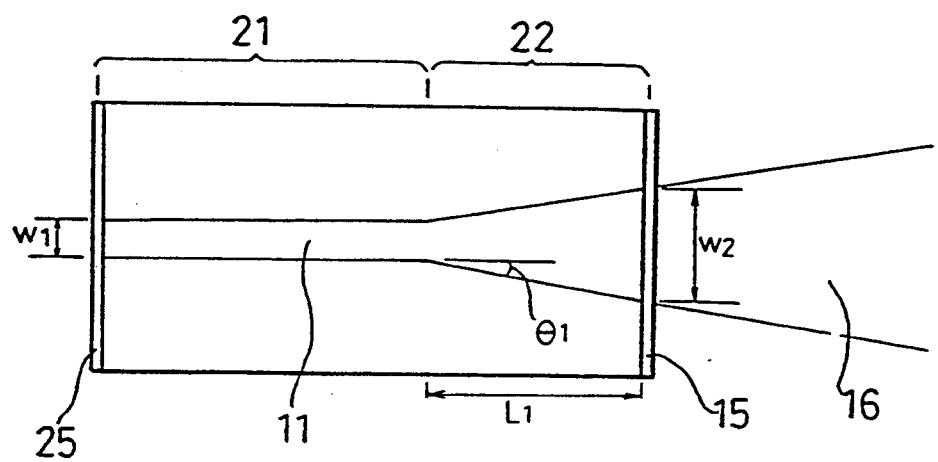
FIG. 2 is a plan view showing an active layer surface of conventional laser with a wide active region.
Figure 7:
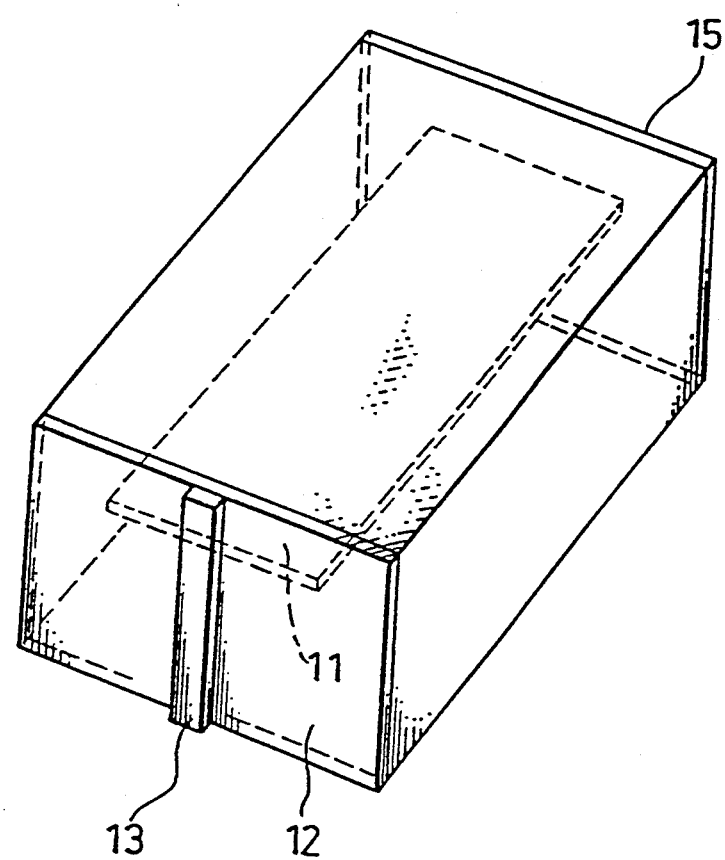
FIG. 7 is a perspective view showing the semiconductor laser device shown in FIG. 1 seen from the direction of the facet opposite to the emitting facet.

FIG. 1 is a plan view showing an active layer surface of a semiconductor laser in accordance with an embodiment of the present invention. FIG. 7 is a perspective view seen from the facet opposite to the laser light emitting facet. The figures, a laser active region 11 is arranged at the center of an active layer in the direction of its width and a partially reflecting coating 15 whose reflectivity is approximately 3 to 18% is applied to the whole surface of the emitting facet. A non-reflecting coating 12 whose reflectivity is approximately 3% is applied to the whole surface of a resonator facet opposite to the emitting facet and a highly reflecting partial coating 13 whose reflectivity is 90% or more is applied to the center on the non-reflecting coating 12 in the direction of a width of the laser active region 11. Reference numeral 16 designates output light and reference numeral 14 designates monitor light. In addition, the length of the resonator is approximately 500 μm.

In this case, as materials for the non-reflecting coating 12, the partially reflecting coating 15 and the highly reflecting coating 13, an Al$_2$O$_3$ film, an amorphous silicon film, SiO$_2$ film or the like are used and the desired reflectivity can be obtained by changing the thicknesses or combinations of those films.

Next, operation thereof will be described.

Light generated in the laser active region 11 of the semiconductor laser device reaches the non-reflecting coating 12 and the highly reflecting partial coating 13 on the rear facet. The light which reaches the non-reflecting coating 12 becomes monitor light 14 as it is without any reflection. The light which reaches the highly reflecting partial coating 13 is reflected and amplified in the laser active region 11 again and expands a little and then reaches the partially reflecting coating 15 on the front facet. Most of this light is output as laser output light 16 and a part of it is reflected by the partially reflecting coating 15 and amplified in the laser active region 11 again and then reaches the non-reflecting coating 12 and the high reflecting partial coating 13 on the rear facet to contribute to laser oscillation. Although the returned light is magnified in the space, the light is hardly reflected at the non-reflecting coating 12 on the rear facet. Therefore, even if the light is magnified and both its sides are removed, the fundamental mode which has almost the same configuration as that of an original mode can be most easily generated.

The principle of this embodiment of the present invention in which a laser is output with high output will be described. FIG. 5 is a graph showing the relationship between injection current and light output of the laser, which depends on reflectivity of the emitting facet. More specifically, although the oscillation threshold current of the laser having low emitting facet reflectivity shown by B is higher than that of the laser having high emitting facet reflectivity shown by A, the increase of the light output as a function of the injection current is steep, so that the light output of the laser having low emitting facet reflectivity is far greater than that of the laser having high emitting facet reflectivity at a particular current value. According to the conventional laser shown in FIG. 3, as described in the description of the conventional example, most of the output light is transmitted through the partially reflecting partial coating 34 whose reflectivity is approximately 45% and then output. However, according to the laser in accordance with this embodiment of the present invention, all of the output light is transmitted through the partially reflecting coating 15 whose reflectivity is 3 to 18% and thereby output. Therefore, since the output of the laser of this embodiment is much more than that of the conventional laser shown in FIG. 3 at a particular current value, high power light output oscillation is possible.

Next, the relationship between the oscillation wavelength λ of the laser, the length L of a resonator and the width W of the highly reflecting coating and oscillation in the fundamental mode will be described.

When the light having the wavelength λ in free space advances by the distance L in the semiconductor laser device whose refractive index is n, its image is magnified $$\left(1 + \left(\frac{L\lambda}{n\pi W^2}\right)^2\right)^{\frac{1}{2}}$$

-fold. The greater this magnification, the easier oscillation in only the fundamental mode. According to an experiment, this magnification occurs in practice if the magnifying ratio is 1.002 or more. Therefore, if the following condition obtained by reverse operation, that is, $$L \geq 0.2 \frac{nW^2}{\lambda}$$

is satisfied, the oscillation in only the fundamental mode is easily obtained. Therefore, according to this embodiment, stable fundamental mode oscillation can be implemented by increasing the length L of the resonator in excess of a predetermined value.

In addition, although a single step highly reflecting coating was described in the foregoing embodiment of the present invention, a first highly reflecting coating 51 and a second highly reflecting coating 52 may be formed on the nonreflecting coating 50 in two steps as shown in FIG. 6(a) and also in three or more steps.

In addition, as for the highly reflecting coating, its center may be most highly reflective and the reflectivity gradually lowered at the right and left sides of the center as shown in FIG. 6(b). This kind of coating is obtained with a deposition source close to the laser surface.

In addition, although a particular semiconductor laser structure is not specially described in the above embodiment of the present invention, a stripe structure such as a BH (buried heretojunction type, a SBH (strip buried heretojunction type, a SAS (self aligned structure) type or an electrode stripe type can be used.

As described above, according to the present invention, in a semiconductor laser device having an active region with a wide and uniform width which allows propagation of higher order modes of oscillation, a reflecting film coating having reflectivity smaller than that determined by the difference between the refractive indices of the active layer and air and having no spatial distribution of reflectivity in the direction of the width of the active region is disposed on its emitting facet, and a reflecting film coating having the highest reflectivity at the center of the active region, which reflectivity is lowered at the sides of the center is disposed on the facet opposite to the emitting facet. As a result, a semiconductor laser device oscillating in the fundamental mode with high power light output is obtained.

In addition, according to the present invention, in a semiconductor laser device having an active region with a wide and uniform width which allows propagation of higher order modes of oscillation, a distribution of reflectivity which is the highest at the center of the active region and generally lower at the sides of the center is disposed on the facet opposite to the laser light emitting facet and a magnifying ratio when an image is magnified by diffraction of light is at least a certain value. As a result, oscillation in the fundamental mode can occur more easily than any other mode of oscillation.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor laser comprising:
   an active layer including an active region having a refractive index n and a relatively wide width supporting propagation of fundamental and higher modes of oscillation;
   an emitting facet and a second facet opposite to the emitting facet, the emitting and second facets being transverse to the active layer;
   a first reflecting film having a reflectivity smaller than the reflectivity determined by the differences between a refractive index of the active layer and air and having no spatial distribution of reflectivity along a width of the active region and disposed on the emitting facet of the laser; and
   a second reflecting film disposed on a second facet and having a highest reflectivity at a central portion of the width of the active region and a decreasing reflectivity at both sides of the center of the width of the active region.

2. The semiconductor laser in accordance with claim 1 wherein said second reflecting film comprises a first coating having a relatively low reflectivity disposed on all of the second facet and a second coating having a relatively high reflectivity disposed on a portion of the width of the active region on said first coating centrally relative to the width of the active region.

3. The semiconductor laser in accordance with claim 2 wherein the reflectivity of the first reflecting film is 3 to 18%, the reflectivity of the first coating is approximately 3%, and the reflectivity of the second coating is at least 90%.

4. A semiconductor laser comprising:
   an active region having a refractive index n, a relatively wide width W, and a length L supporting propagation of fundamental and higher order modes of oscillation;
   an emitting facet and a second facet opposite to the emitting facet, the emitting and second facets being transverse to the active layer;
   a first reflecting film having a highest reflectivity at a central portion of the width of the active region and a decreasing reflectivity at both sides of the center of the width of the active region disposed on the second facet wherein $$L \geq 0.2\, (nW^2/\lambda)$$

where $\lambda$ is a wavelength in free space of light produced by the laser.

5. The semiconductor laser in accordance with claim 2 wherein the active region has a length L, the second coating has a width $W_1$ along the width of the active region, and $$L_1 \geq 0.2\, (nW_1^2/\lambda)$$

where $\lambda$ is a wavelength in free space of light produced by the laser.

6. The semiconductor laser according to claim 1 wherein the reflectivity of the second reflecting film decreases gradually from the center of the width of the active region.

7. The semiconductor laser according to claim 1 wherein the reflectivity of the second reflecting film decreases stepwise from the center of the width of the active region.

* * * * *